United States Patent
Suzuki

[11] Patent Number: 6,094,078
[45] Date of Patent: Jul. 25, 2000

[54] PHASE-LOCKED LOOP CIRCUIT

[75] Inventor: Ryouichi Suzuki, Osaka, Japan

[73] Assignee: Matsushita Electric Industrial Co., Ltd., Osaka, Japan

[21] Appl. No.: 09/174,467

[22] Filed: Oct. 19, 1998

[30] Foreign Application Priority Data

Oct. 21, 1997 [JP] Japan ................................ 9-288176

[51] Int. Cl.⁷ .................................................. H03L 7/06
[52] U.S. Cl. ........................ 327/156; 327/158; 327/159; 327/157
[58] Field of Search .................. 327/156, 157, 327/158, 159, 147, 148

[56] References Cited

U.S. PATENT DOCUMENTS

| | | | |
|---|---|---|---|
| 4,322,643 | 3/1982 | Preslar | 307/528 |
| 4,612,515 | 9/1986 | Ohkawa et al. | 331/1 A |
| 5,095,287 | 3/1992 | Irwin | 331/1 A |
| 5,550,515 | 8/1996 | Liang | 331/11 |

FOREIGN PATENT DOCUMENTS

| | | |
|---|---|---|
| 52-137958 | 11/1977 | Japan . |
| 59-198028 | 11/1984 | Japan . |
| 1-180118 | 7/1989 | Japan . |
| 8-56122 | 2/1996 | Japan . |
| 9-289446 | 11/1997 | Japan . |

*Primary Examiner*—Timothy P. Callahan
*Assistant Examiner*—Cassandra Cox
*Attorney, Agent, or Firm*—Eric J. Robinson; Nixon Peabody LLP

[57] ABSTRACT

A PLL circuit taking a shorter time to accomplish phase locking with reduced jitter is provided. A phase/frequency detector circuit section includes: a first phase/frequency detector having phase/frequency difference detection characteristic substantially free from a dead zone; and a second phase/frequency detector having phase/frequency difference detection characteristic with a dead zone of a predetermined width. If the phase/frequency difference between a reference signal and a signal to be compared is too small to be detected by the second phase/frequency detector, only the first phase/frequency detector detects the phase/frequency difference. On the other hand, if the phase/frequency difference between the reference signal and the signal to be compared is sufficiently large, then both the first and second phase/frequency detectors detect phase/frequency difference. Thus, if the phase/frequency difference between the reference signal and the signal to be compared is large, a large amount of current is supplied from a charging pump circuit section to a low-pass filter. Conversely, if the phase/frequency difference is small, a small amount of current is supplied from the charging pump circuit to the low-pass filter.

8 Claims, 8 Drawing Sheets

PHASE-LOCKED LOOP CIRCUIT

BACKGROUND OF THE INVENTION

The present invention relates to a phase-locked loop (PLL) circuit used for a semiconductor integrated circuit.

A PLL circuit includes: a phase/frequency detector for detecting phase/frequency difference between two input signals; a charging pump circuit for converting the phase/frequency difference, detected by the phase/frequency detector, into a current value; a low-pass filter for converting the sum of current, supplied from the charging pump circuit, into a voltage value; a voltage-controlled oscillator having an oscillation frequency variable with a voltage value thereof; and (if necessary) a divider circuit for dividing the frequency of the output signal of the voltage-controlled oscillator.

Hereinafter, a conventional PLL circuit will be described with reference to FIG. 8.

FIG. 8 is a block diagram of a conventional PLL circuit. As shown in FIG. 8, the PLL circuit includes: a phase/frequency detector (PFD) 110; a charging pump circuit (CP) 120; a low-pass filter (LPF) 31; a voltage-controlled oscillator (VCO) 32; a divider (1/N) 33 for dividing the frequency of an input signal by N; an input pin IN; and an output pin OUT. REFCLK denotes a reference signal externally input through the input pin IN. And DEVCLK denotes a signal produced by the PLL circuit.

The conventional PLL circuit shown in FIG. 8 operates in the following manner. The phase/frequency detector 110 compares the phase/frequency of the reference signal REFCLK to that of the produced signal DEVCLK, and provides the phase/frequency difference to the charging pump circuit 120. The charging pump circuit 120 converts the phase/frequency difference between the reference signal REFCLK and the produced signal DEVCLK into a current value. The sum of these current values is converted by the LPF 31 into a voltage value. The transfer function from the phase/frequency detector 110 to the LPF 31 can be represented as Kp [V/rad].

The VCO 32 oscillates at a predetermined frequency in accordance with the value of an input voltage. The transfer function of the VCO 32 can be represented as Kv [rad/sV]. The loop ranging from the phase/frequency detector 110 to the VCO 32 can synchronize the frequency of the reference signal REFCLK with that of the produced signal DEVCLK. Phase locking of a PLL circuit refers to this synchronization between the frequency of the reference signal REFCLK and that of the produced signal DEVCLK.

In FIG. 8, the oscillated output signal of the VCO 32 is not only output through the output pin OUT, but also input to the phase/frequency detector 110 as the produced signal DEVCLK after the frequency thereof has been divided by the divider 33 by N. In such a configuration, the PLL circuit may output a signal, the frequency of which is N times as high as that of the reference signal REFCLK.

However, in the conventional PLL circuit, the transfer function Kp from the phase/frequency detector 110 to the LPF 31 is constant irrespective of the magnitude of the phase/frequency difference between the reference signal REFCLK and the produced signal DEVCLK. Thus, for example, if the phase/frequency difference between the reference signal REFCLK and the produced signal DEVCLK is large in an initial state, then it takes a rather long time for the PLL circuit to accomplish phase locking.

In order to get the PLL circuit to accomplish phase locking in a shorter period of time, it is effective to set the transfer function Kp from the phase/frequency detector 110 to the LPF 31 at a larger value. If the transfer function Kp is simply increased, then the phase/frequency difference is much smaller until just before the PLL circuit accomplishes phase locking. However, since the value of a dumping factor ξ becomes larger, various problems possibly happen. For example, large jitter may be generated or locking may be incomplete.

SUMMARY OF THE INVENTION

The object of the present invention is providing a PLL circuit taking a shorter time to accomplish phase locking with reduced jitter. Specifically, according to the present invention, the transfer function from a phase/frequency detector circuit section to a low-pass filter is variable with the magnitude of the phase/frequency difference between a reference signal and a signal to be compared. If the phase/frequency difference is large, then the value of the transfer function is also large. On the other hand, if the phase/frequency difference is small, then the value of the transfer function is also small.

Specifically, the phase-locked loop circuit of the present invention includes: a phase/frequency detector circuit section for comparing the phase/frequency of a reference signal to that of a signal to be compared; and a charging pump circuit section for supplying current to a low-pass filter based on results of comparison in the phase/frequency detector circuit section. The phase/frequency detector circuit section includes: a first phase/frequency detector comparing the phase/frequency of the reference signal to that of the signal to be compared, and having a phase/frequency difference detection characteristic with a dead zone having a first width; and a second phase/frequency detector comparing the phase/frequency of the reference signal to that of the signal to be compared, and having a phase/frequency difference detection characteristic with a dead zone of a second width wider than the first width. If the first phase/frequency detector has detected a phase/frequency difference and the second phase/frequency detector has detected no phase/frequency difference, the charging pump circuit section decreases the amount of current supplied to the low-pass filter as compared with a case that the first and second phase/frequency detectors have both detected phase/frequency difference.

In the phase/frequency detector circuit section of the present invention, if the phase/frequency of the reference signal is greatly different from that of the signal to be compared, both the first and second phase/frequency detectors detect the phase/frequency difference. On the other hand, if the phase/frequency difference between the reference signal and the signal to be compared is too small to be detected by the second phase/frequency detector having a phase/frequency difference detection characteristic with a dead zone of a predetermined width, the first phase/frequency detector detects the phase/frequency difference but the second phase/frequency detector does not. If the first phase/frequency detector has detected a phase/frequency difference and the second phase/frequency detector has detected no phase/frequency difference, the charging pump circuit section decreases the amount of current supplied to the low-pass filter as compared with a case that the first and second phase/frequency detectors have both detected the phase/frequency difference. Thus, if the phase/frequency difference between the reference signal and the signal to be compared is large, a large amount of current is supplied to the low-pass filter. Conversely, if the phase/frequency difference is too small to be detected by the second phase/ frequency detector, a small amount of current is supplied to the low-pass filter. Accordingly, if the phase/frequency difference between the reference signal and the signal to be compared is large, the value of the transfer function from the phase/frequency detector circuit section to the low-pass filter is large. on the other hand, if the phase/frequency difference is small, the value of the transfer function is also small. Consequently, a phase-locked loop taking a shorter time to accomplish phase locking with reduced jitter can be provided.

DESCRIPTION OF THE PREFERRED EMBODIMENTS

Figure 1:
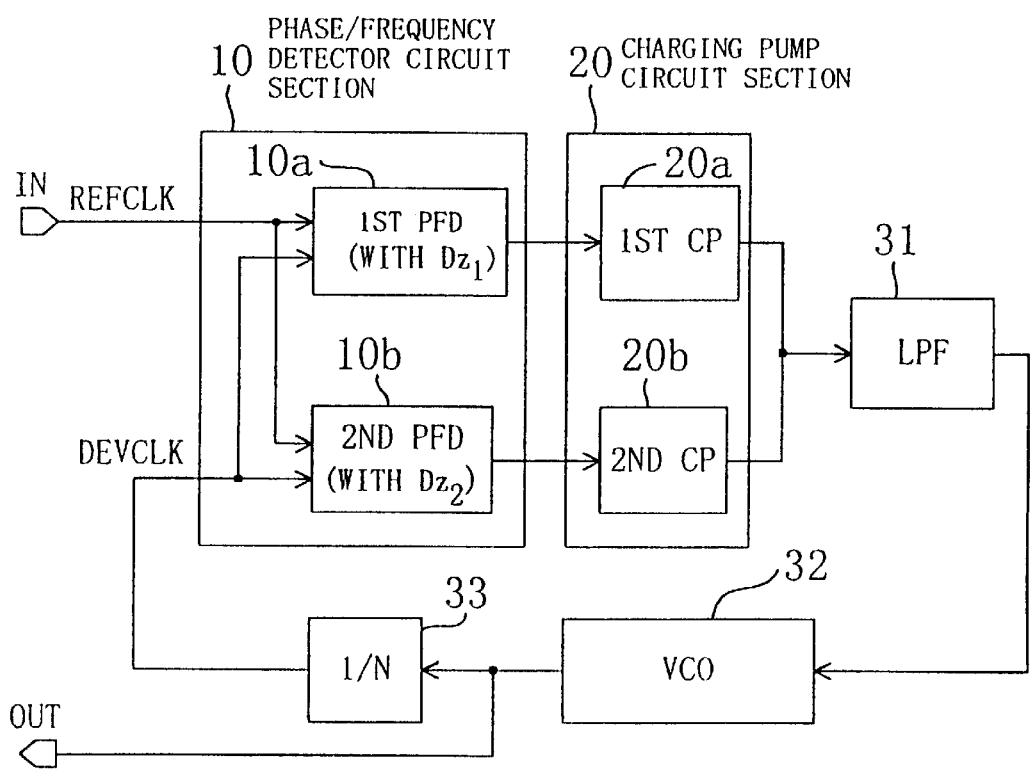
FIG. 1 is block diagram illustrating a configuration for a PLL circuit in one embodiment of the present invention.

FIG. 1 is a block diagram illustrating a schematic configuration of a PLL circuit in one embodiment of the present invention. As shown in FIG. 1, the PLL circuit includes: a phase/frequency detector circuit section 10 for comparing the phase/frequency of a reference signal REFCLK to that of a produced signal DEVCLK as a signal to be compared; a charging pump circuit section 20 for supplying current to a low-pass filter 31 in accordance with the results of comparison in the phase/frequency detector circuit section 10; the low-pass filter (LPF) 31; a voltage-controlled oscillator (VCO) 32; and a divider (1/N) 33 for dividing the frequency of an input signal by N.

The phase/frequency detector circuit section 10 includes: a first phase/frequency detector (PFD) 10a having a phase/frequency difference detection characteristic with a dead zone Dz, having a first width; and a second phase/frequency detector (PFD) 10b having a phase/frequency difference detection characteristic with a dead zone $Dz_2$ having a second width wider than the first width. Both the first and second phase/frequency detectors 10a and 10b compare the phase/frequency of the reference signal REFCLK to that of the produced signal DEVCLK and output signals representing the results of comparison. The charging pump circuit section 20 includes first and second charging pump circuits 20a and 20b. The first charging pump circuit 20a supplies current to the low-pass filter 31 in response to the output signal of the first phase/frequency detector 10a. Similarly, the second charging pump circuit 20b supplies current to the low-pass filter 31 in response to the output signal of the second phase/frequency detector 10b.

Figure 2:
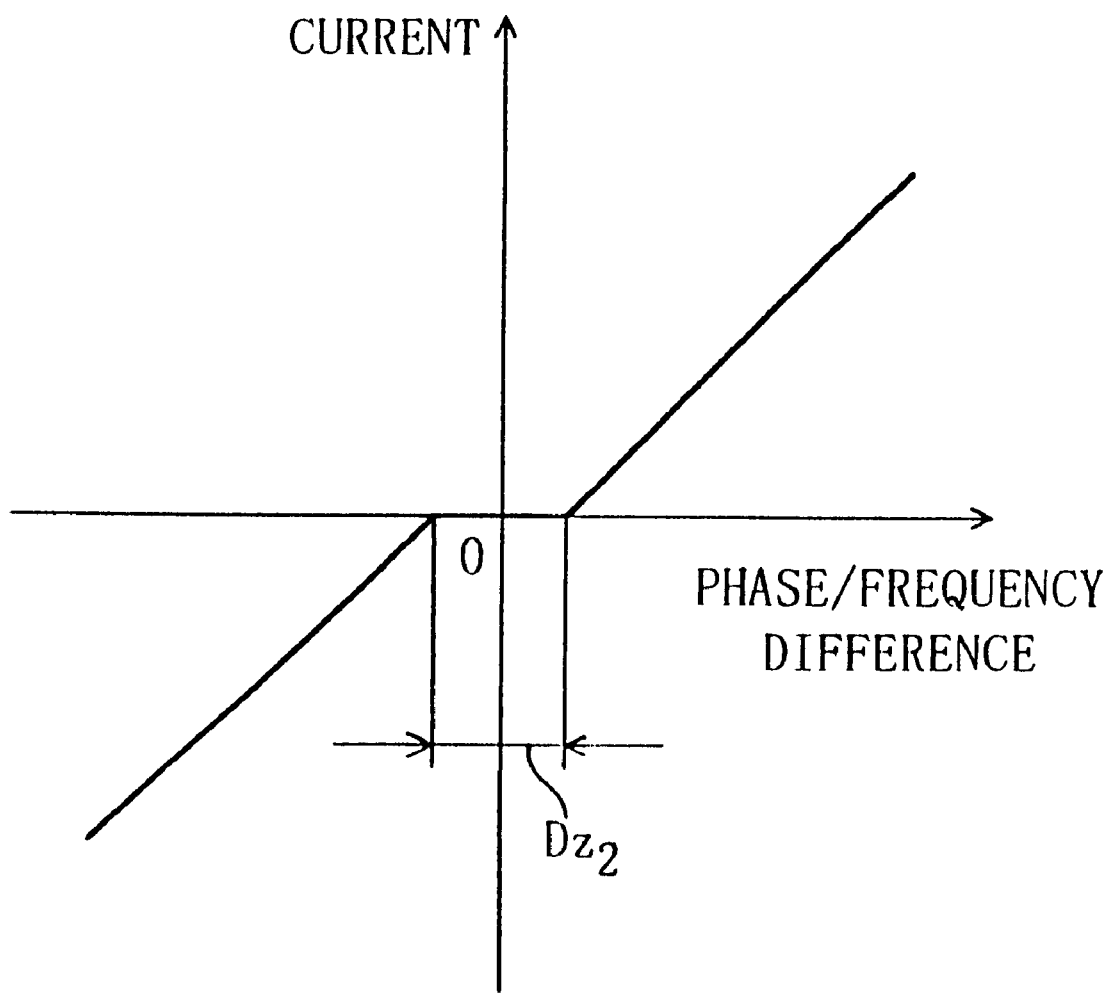
FIG. 2 is a graph showing the characteristic of a combination of a phase/frequency detector having a dead zone and a charging pump circuit.

FIG. 2 is a graph showing the characteristic of a combination of a phase/frequency detector having a dead zone and a charging pump circuit, i.e., a graph showing a relationship between phase/frequency difference and current. In FIG. 2, the axis of ordinates represents current and the axis of abscissas represents phase/frequency difference. As shown in FIG. 2, the dead zone is a range $Dz_2$, in which the amount of current supplied is zero, because the frequency difference between the two signals to be compared is small.

The characteristic of the second phase/frequency detector 10b and the second charging pump circuit 20b in the PLL circuit of the embodiment shown in FIG. 1 is as represented in FIG. 2. Accordingly, if the reference signal REFCLK has a higher frequency than that of the produced signal DEVCLK, the second charging pump circuit 20b supplies positive current to the low-pass filter 31. On the other hand, if the reference signal REFCLK has a lower frequency than that of the produced signal DEVCLK, the second charging pump circuit 20b supplies negative current to the low-pass filter 31. In other words, the circuit 20b extracts current from the lowpass filter 31. Also, while the frequency difference between the reference signal REFCLK and the produced signal DEVCLK is small and located within the dead zone $Dz_2$, the second charging pump circuit 20b does not supply current to the low-pass filter 31.

Figure 3:
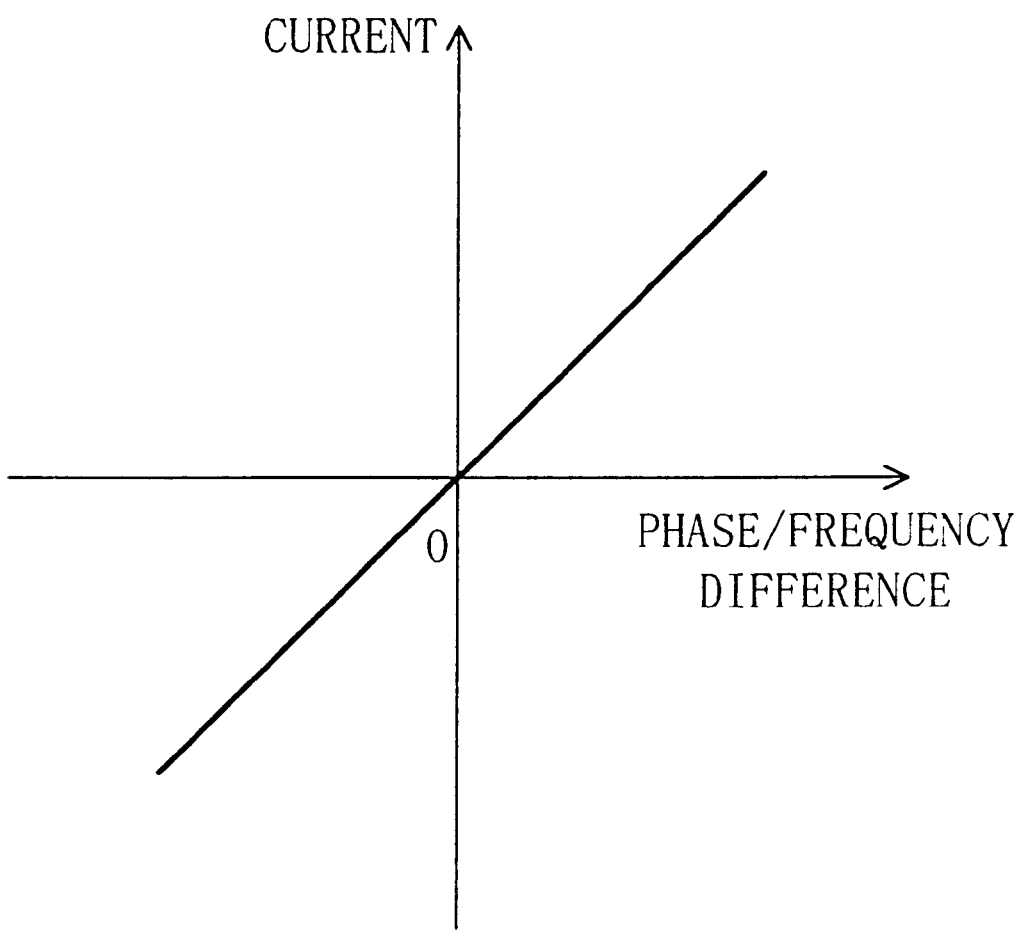
FIG. 3 is a graph showing the characteristic of a combination of a phase/frequency detector having no dead zone and a charging pump circuit.

On the other hand, FIG. 3 is a graph showing the characteristic of a combination of a phase/frequency detector having a narrow dead zone $Dz_1$ and a charging pump circuit i.e., a graph showing a relationship between phase/frequency difference and current. In FIG. 3, the axis of ordinates also represents current and the axis of abscissas also represents phase/frequency difference in the same way as in FIG. 2. If a phase/frequency detector having a narrow dead zone $Dz_1$ is used, then the jitter of the produced signal decreases. As a result, a high-performance PLL circuit can be designed.

The characteristic of the first phase/frequency detector 10a and the first charging pump circuit 20a in the PLL circuit of the embodiment shown in FIG. 1 is as represented in FIG. 3. Accordingly, if the reference signal REFCLK has a higher frequency than that of the produced signal DEVCLK, the first charging pump circuit 20a supplies positive current to the low-pass filter 31. On the other hand, if the reference signal REFCLK has a lower frequency than that of the produced signal DEVCLK, the first charging pump circuit 20a supplies negative current to the low-pass filter 31. In other words, the circuit 20a extracts current from the low-pass filter 31.

Figure 4:
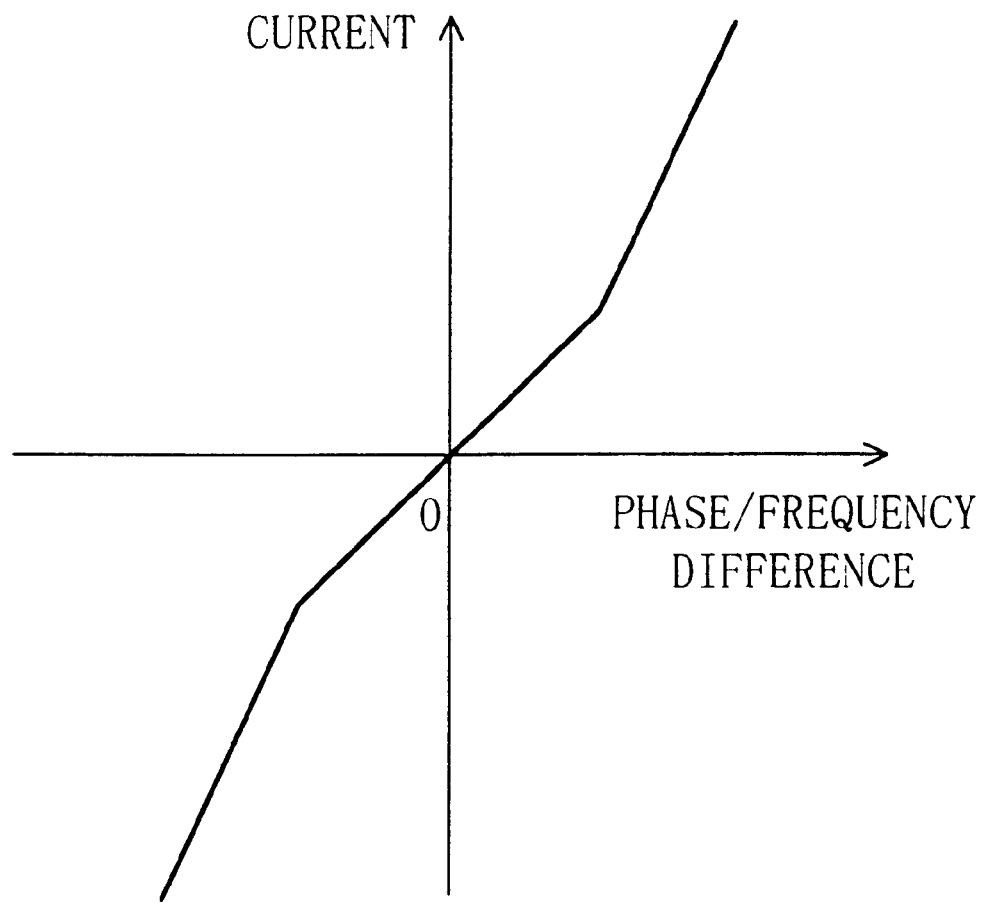
FIG. 4 is a graph showing the characteristics of a combination of a phase/frequency detector circuit section and a charging pump circuit section in the embodiment of the present invention.

FIG. 4 is a graph showing the characteristic of a combination where a phase/frequency detector having a narrow dead zone $Dz_1$ and a charging pump circuit are connected in parallel to a phase/frequency detector having a wider dead zone $Dz_2$ and a charging pump circuit, i.e., a graph showing a relationship between phase/frequency difference and current. The characteristic of the phase/frequency detector circuit section 10 and the charging pump circuit section 20 in the PLL circuit of the embodiment shown in FIG. 1 is as represented in FIG. 4. Specifically, if the phase/frequency difference between the reference signal REFCLK and the produced signal DEVCLK is relatively large, both the first and second phase/frequency detectors 10a and 10b detect the phase/frequency difference. Accordingly, both the first and second charging pump circuits 20a and 20b supply current to the low-pass filter 31. As a result, the rate of change Kp of the current is abrupt. On the other hand, if the phase/frequency difference between the reference signal REFCLK and the produced signal DEVCLK is relatively small, then the second phase/frequency detector 10b exhibits a characteristic located in the dead zone $Dz_2$. Accordingly, only the first charging pump circuit 20a supplies current to the low-pass filter 31. As a result, the rate of change Kp of the current is less abrupt. Consequently, the configuration shown in FIG. 1 realizes a PLL circuit taking a shorter time to accomplish phase locking with reduced jitter.

Next, the specific circuit configurations of the phase/frequency detector circuit section 10 and the charging ump circuit section 20 will be described.

Figure 5:
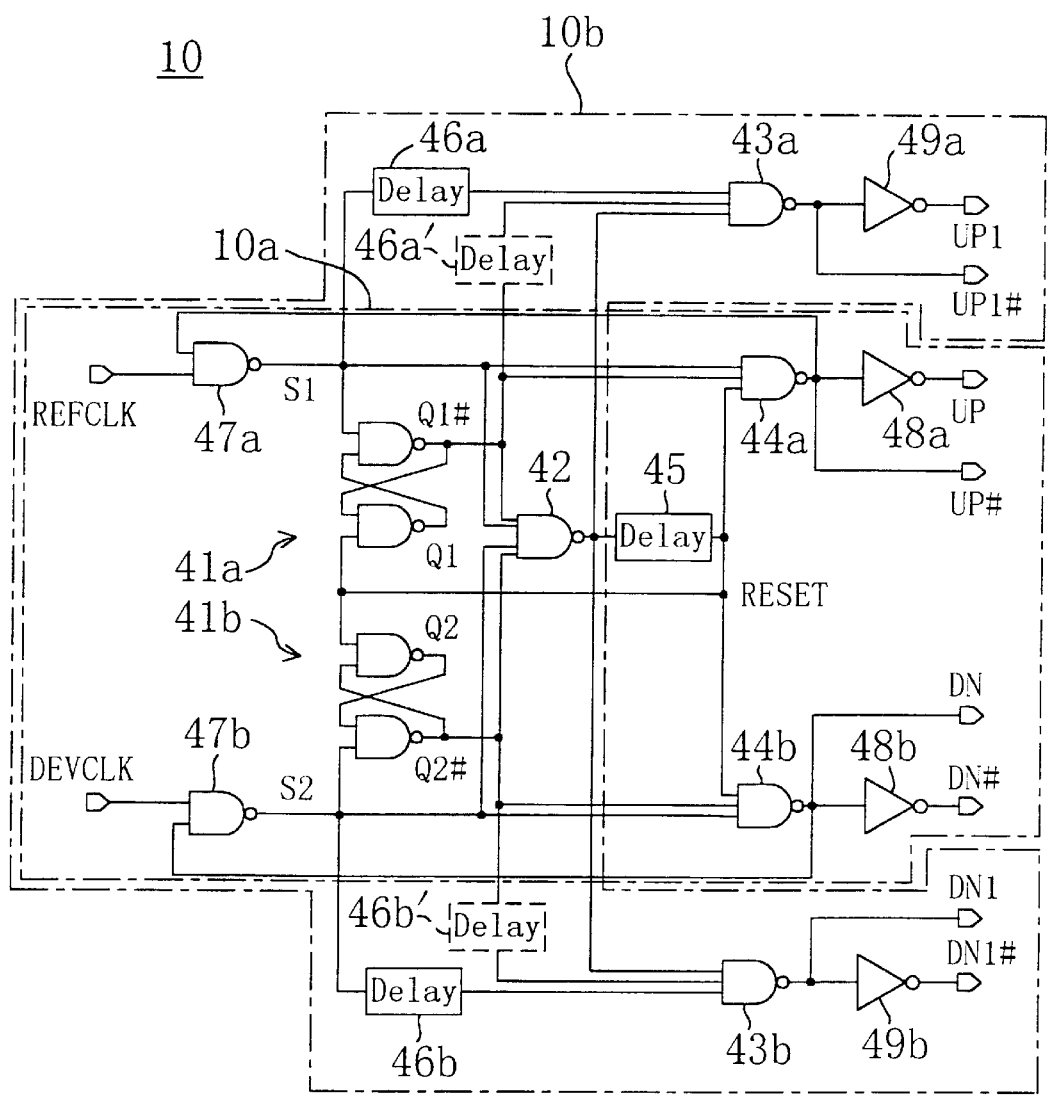
FIG. 5 is a circuit diagram illustrating an exemplary configuration for the phase/frequency detector circuit section in the PLL circuit in the embodiment of the present invention.

FIG. 5 is a circuit diagram illustrating an exemplary configuration for the phase/frequency detector circuit section 10 in the PLL circuit in the embodiment shown in FIG. 1. As shown in FIG. 5, the phase/frequency detector circuit section 10 includes: first and second RS latches 41a and 41b, each including two-input NAND gates; a four-input NAND gate 42 functioning as a reset circuit; first, second, third and fourth three-input NAND gates 43a, 43b, 44a and 44b; delay devices 45, 46a and 46b; two-input NAND gates 47a and 47b; and inverters 48a, 48b, 49a and 49b.

In the configuration shown in FIG. 5, the first and second phase/frequency detectors 10a and 10b share the first and second RS latches 41a and 41b, the four-input NAND gate 42 and the two-input NAND gates 47a and 47b in common with each other. Accordingly, the circuit size of the phase/frequency detector circuit section 10 can be reduced and the layout area of the PLL circuit can also be reduced. Alternatively, the first phase/frequency detector 10a having a narrow dead zone $Dz_1$ and the second phase/frequency detector 10b having a wider dead zone $Dz_2$ may be naturally provided separately as shown in the block diagram of FIG. 1.

As shown in FIG. 5, the first phase/frequency detector 10a includes: the first and second RS latches 41a and 41b; the four-input NAND gate 42; the third and fourth three-input NAND gates 44a and 44b; the delay device 45; the two-input NAND gates 47a and 47b; and the inverters 48a, 48b. The first phase/frequency detector 10a outputs: a signal UP indicating whether or not a phase lead exists in the reference signal REFCLK; the inverted signal thereof UP#; a signal DN indicating whether or not a phase lag exists in the reference signal REFCLK; and the inverted signal thereof DN#. In the first phase/frequency detector 10a, the reset signal output from the four-input NAND gate 42 is delayed by the delay device 45 and then supplied to the first and second RS latches 41a and 41b and the third and fourth three-input NAND gates 44a and 44b, thereby substantially narrowing the width of the dead zone. The operating principle is described, for example, by Toshiyuki Ozawa in "PLL Frequency Synthesizer and Method for Designing the Same", Sogodenshi Shuppansha, Jul. 10, 1994.

On the other hand, the second phase/frequency detector 10b includes: the first and second RS latches 41a and 41b; the four-input NAND gate 42; the first and second three-input NAND gates 43a and 43b; the delay devices 46a and 46b; the two-input NAND gates 47a and 47b; and the inverters 49a, 49b. The second phase/frequency detector 10b outputs: a signal UPl indicating whether or not a phase lead exists in the reference signal REFCLK; the inverted signal thereof UPl#; a signal DNl indicating whether or not a phase lag exists in the reference signal REFCLK; and the inverted signal thereof DNl#.

The delay devices 46a and 46b are provided for the second phase/frequency detector 10b. The S input signal S1 of the first RS latch 41a is input to the first three-input NAND gate 43a by way of the delay device 46a. Similarly, the S input signal S2 of the second RS latch 41b is input to the second three-input NAND gate 43b by way of the delay device 46b. As a result, a dead zone is caused in the characteristic thereof. The range of the dead zone can be arbitrarily set in accordance with the delay times of the delay devices 46a and 46b.

In this manner, the S input signal of the first RS latch is input to the first three-input NAND gate by way of the delay device. Similarly, the S input signal of the second RS latch is input to the second three-input NAND gate by way of the delay device. As a result, in wider the second phase/frequency detector, a dead zone of a predetermined width is caused in the phase/frequency difference detection characteristic. Accordingly, the second phase/frequency detector having a dead zone of a predetermined width in the phase/frequency difference detection characteristic can be implemented to have a simple configuration similar to that of a conventional phase/frequency detector.

In the second phase/frequency detector 10b shown in FIG. 5, in order to cause the wider dead zone in the characteristic thereof, the delay devices 46a and 46b are inserted between the S inputs of the RS latches 41a, 41b and the associated inputs of the three-input NAND gates 43a, 43b, respectively. Alternatively, delay devices 46a' and 46b' may be inserted between the inverted outputs of the RS latches 41a, 41b and the associated inputs of the three-input NAND gates 43a, 43b, respectively.

In this manner, the output signal of the first RS latch is input to the first three-input NAND gate by way of the delay device. Similarly, the output signal of the second RS latch is input to the second three-input NAND gate by way of the delay device. As a result, in the second phase/frequency detector, a dead zone of a predetermined width is caused in the phase/frequency difference detection characteristic. Accordingly, the second phase/frequency detector having a dead zone of a predetermined width in the phase/frequency difference detection characteristic wider than the width of the dead zone of the first phase/frequency detector can be implemented to have a simple configuration similar to that of a conventional phase/frequency detector.

Figure 6:
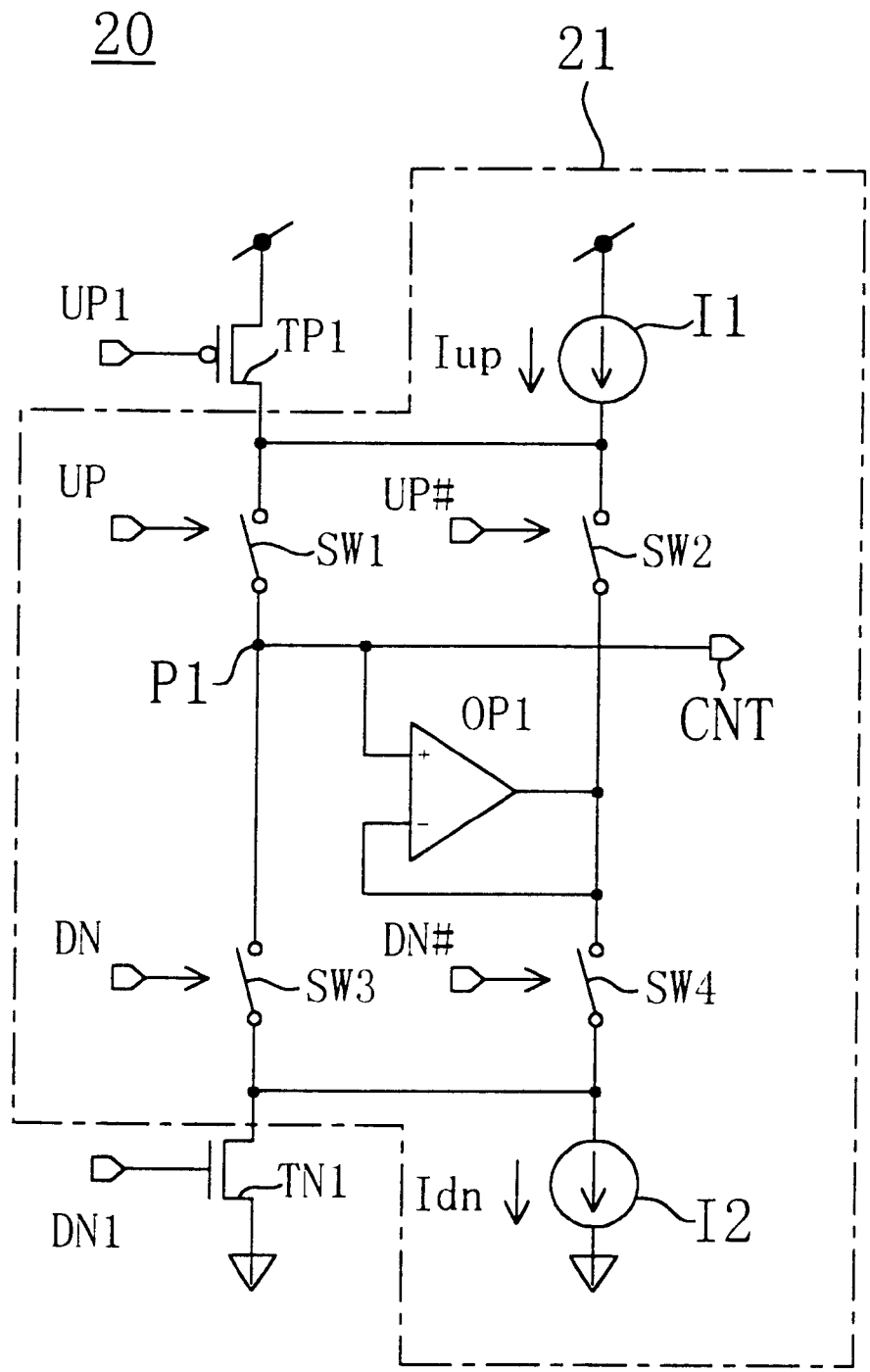
FIG. 6 is a circuit diagram illustrating an exemplary configuration for the charging pump circuit section in the PLL circuit in the embodiment of the present invention.

FIG. 6 is a circuit diagram illustrating an exemplary configuration for the charging pump circuit section 20 in the PLL circuit in the embodiment shown in FIG. 1. As shown in FIG. 6, the charging pump circuit section 20 includes: first and second constant current sources I1, I2; switches SW1, SW2, SW3, SW4 turning ON/OFF in response to the signals UP, UP#, DN, DN#, respectively, output from the first phase/frequency detector 10a of the phase/frequency detector circuit section 10; an operational amplifier OPl; a p-channel transistor TP1; and an n-channel transistor TN1. P1 is a current supply point and CNT is an output terminal for supplying current from the current supply point P1 to the lowpass filter 31.

In FIG. 6, a basic charging pump circuit 21, functioning as the first charging pump circuit 20a, includes: the first and second constant current sources I1, I2; the switches SW1, SW2, SW3, SW4; and the operational amplifier OP1. The charging pump circuit section 20 is formed by additionally providing the transistors TP1 and TN1 for the basic charging pump circuit 21. The p-channel transistor TP1 operates as a first current controlling switch in response to the signal UP1 output from the second phase/frequency detector 10b. On the other hand, the n-channel transistor TN1 operates as a second current controlling switch in response to the signal DN1 output from the second phase/frequency detector 10b. The function of the second charging pump circuit 20b is realized by the addition of the p- and n-channel transistors TP1 and TN1.

That is to say, the functions of the first and second charging pump circuits 20a, 20b shown in FIG. 1 are realized by the configuration shown in FIG. 6 alone. As a result, the circuit size of the charging pump circuit section 20 can be reduced and the layout area of the PLL circuit can also be reduced. Alternatively, the first and second charging pump circuits 20a, 20b may be naturally implemented by known charging pump circuits without adopting the configuration shown in FIG. 6.

The values Iup and Idn of the current respectively flowing through the first and second constant current sources I1 and I2 are equal to each other. If the phase/frequency detector circuit section 10 detects no phase/frequency difference, the switches SW2 and Sw4 are turned ON, while the switches SW1 and Sw3 are OFF. Also, neither the p-channel transistor TP1 nor the n-channel transistor TN1 is conductive. As a result, the current flows from the first constant current source I1 through the switches SW2 and SW4 and the second constant current source I2 into the ground.

On the other hand, if the first phase/frequency detector 10a does detect phase/frequency difference, the switch SW1 or SW3 is turned ON. Specifically, if the signal UP indicates that a phase lead has been detected in the reference signal REFCLK, the switch SW1 is turned ON while the switch SW2 is turned OFF. And if the signal DN indicates that a phase lag has been detected in the reference signal REFCLK, the switch SW3 is turned ON while the switch SW4 is turned OFF. The out-put terminal CNT is connected to the low-pass filter 31. Thus, a predetermined amount of current, determined by the capacity of the first and second constant current sources I1 and I2, is supplied to or extracted from the low-pass filter 31 in accordance with the operations of the switches SW1, SW2, SW3 and SW4. In this manner, the voltage value at the low-pass filter 31 can be changed.

If the phase/frequency difference between the reference signal REFCLK and the produced signal DEVCLK is so large that the second phase/frequency detector 10b, as well as the first phase/frequency detector 10a, has detected the phase/frequency difference, either the p-channel transistor TP1 or the n-channel transistor TN1 is conductive. Specifically, if the second phase/frequency detector 10b has detected a phase lead in the reference signal REFCLK, the p-channel transistor TP1 is turned ON in response to the signal UP1. On the other hand, if the second phase/frequency detector 10b has detected a phase lag in the reference signal REFCLK, the n-channel transistor TN1 is turned ON in response to the signal DN1. Accordingly, an even larger amount of current is supplied to the low-pass filter 31. As a result, the potential changes more drastically in the low-pass filter 31 than the case only the first phase/frequency detector 10a has detected a phase/frequency difference. Though the increase of current is indefinite in such a case, there is no problem. This is because it is not always necessary to control current precisely if the phase/frequency difference between two signals is large.

Figure 7:
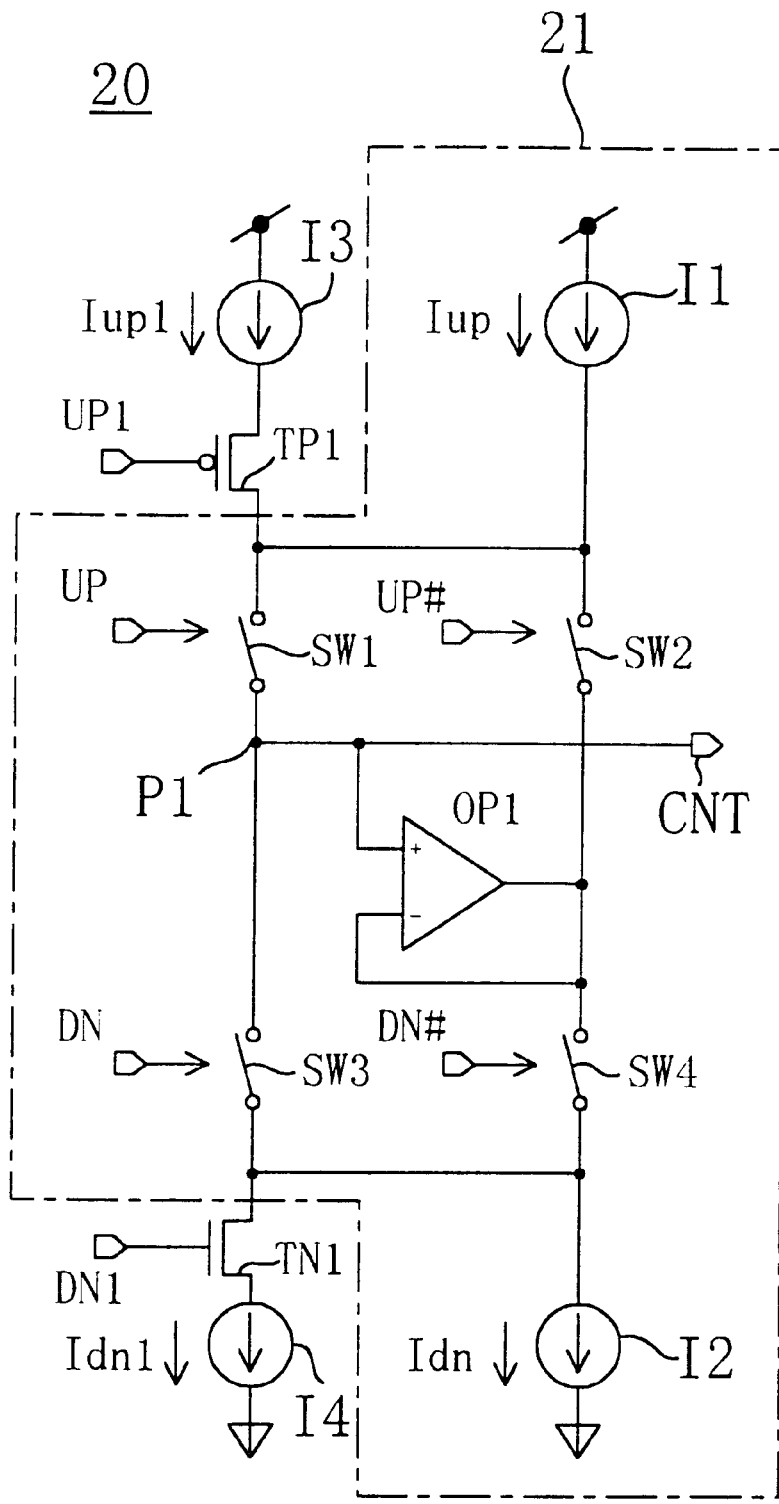
FIG. 7 is a circuit diagram illustrating another exemplary configuration for the charging pump circuit section in the PLL circuiton the embodiment of the present invention.
Figure 8:
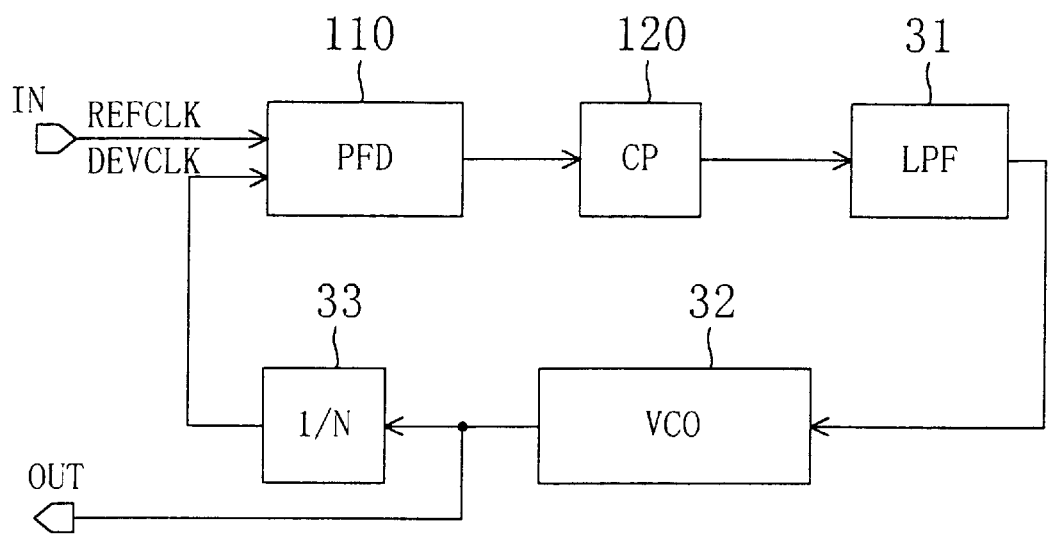
FIG. 8 is a block diagram illustrating a configuration for a conventional PLL circuit.

FIG. 7 is a circuit diagram illustrating another exemplary configuration for the charging pump circuit section 20 in the PLL circuit in the embodiment shown in FIG. 1. In FIG. 7, the same components as those illustrated in FIG. 6 are identified by the same reference numerals. I3 and I4 denote third and fourth constant current sources. The current values thereof Iup1 and Idn1 are equal to each other.

In the configuration shown in FIG. 7, the sources of the transistors TP1 and TN1 as the current controlling switches are not directly connected to the power supply line and the ground line, respectively, but indirectly connected thereto through the third and fourth constant current sources I3 and I4. Accordingly, the amount of current flowing when the transistors TP1 and TN1 are turned ON is controlled at a predetermined value. Thus, even when the phase/frequency difference between two signals is large, the amount of current supplied to the low-pass filter 31 can be precisely controlled.

In the foregoing embodiment, the phase/frequency detector circuit section 10 includes the two phase/frequency detectors, i.e., the first phase/frequency detector 10a having a phase/frequency difference detection characteristic with a dead zone having a first width and the second phase/frequency detector 10b having a phase/frequency difference detection characteristic with a dead zone of a second width wider than the first width. However, the present invention is not limited to such a configuration. Alternatively, the phase/frequency detector circuit section 10 may also be a combination of three or more phase/frequency detectors including: a phase/frequency detector having a phase/frequency difference detection characteristic with a dead zone having a first width; and at least two phase/frequency detectors having respective phase/frequency difference detection characteristics with respective dead zones of mutually different predetermined widths wider than the first width. In such a configuration, the same effects as those of this embodiment can also be attained.

As is apparent from the foregoing description, in accordance with the present invention, if phase/frequency difference between a reference signal and a signal to be compared is large, a large amount of current is supplied to a low-pass filter. On the other hand, if the difference is too small to be detected by a second phase/frequency detector having a phase/frequency difference detection characteristic with a dead zone of a predetermined width, a small amount of current is supplied to the low-pass filter. As a result, a phase-locked loop circuit taking a shorter time to accomplish phase locking with reduced jitter is realized. Also, by modifying the configurations of a phase/frequency detector circuit section and a charging pump circuit section, it is possible to prevent the layout area of the phase-locked loop circuit of the present invention from being increased.

What is claimed is:

1. A phase-locked loop circuit comprising:
   a phase/frequency detector circuit section for comparing the phase/frequency of a reference signal to that of a signal to be compared; and
   a charging pump circuit section for supplying current to a low-pass filter based on results of comparison in the phase/frequency detector circuit section,
   wherein the phase/frequency detector circuit section includes:
      a first phase/frequency detector comparing the phase/frequency ofthe reference signal to that of the signal to be compared, and having a phase/frequency difference detection characteristic with a dead zone having a first width; and
      a second phase/frequency detector comparing the phase/frequency of the reference signal to that of the signal to be compared, and having a phase/frequency difference detection characteristic with a dead zone of a second width wider than the first width, and wherein if the first phase/frequency detector has detected a phase/frequency difference and the second phase/frequency detector has detected no phase/frequency difference, the charging pump circuit section decreases the amount of current supplied to the low-pass filter as compared with a case that the first and second phase/frequency detectors have both detected phase/frequency difference.

2. The phase-locked loop circuit of claim 1, wherein the second phase/frequency detector comprises:
   a first RS latch receiving a signal, produced from the reference signal, as an S input;
   a second RS latch receiving a signal, produced from the signal to be compared, as an S input;
   a reset circuit receiving the S input signals and output signals of the first and second RS latches, and producing and outputting a reset signal for the first and second RS latches;
   a first three-input NAND gate receiving the S input signal and the output signal of the first RS latch and the reset signal; and
   a second three-input NAND gate receiving the S input signal and the output signal of the second RS latch and the reset signal,
   wherein the results of comparison between the phase/frequency of the reference signal and that of the signal to be compared are represented by output signals of the first and second three-input NAND gates,
   and wherein the S input signal of the first RS latch is input to the first three-input NAND gate via a delay device, and the S input signal of the second RS latch is input to the second three-input NAND gate via another delay device.

3. The phase-locked loop circuit of claim 2, wherein the first phase/frequency detector shares the first and second RS latches and the reset circuit in common with the second phase/frequency detector,
   and wherein the first phase/frequency detector includes:
      a third three-input NAND gate receiving the S input signal and the output signal of the first RS latch and the reset signal; and
      a fourth three-input NAND gate receiving the S input signal and the output signal of the second RS latch and the reset signal,
   and wherein the results of comparison between the phase/frequency of the reference signal and that of the signal to be compared are represented by output signals of the third and fourth three-input NAND gates.

4. The phase-locked loop circuit of claim 1, wherein the second phase/frequency detector comprises:
   a first RS latch receiving a signal, produced from the reference signal, as an S input;
   a second RS latch receiving a signal, produced from the signal to be compared, as an S input;
   a reset circuit receiving the S input signals and output signals of the first and second RS latches, and producing and outputting a reset signal for the first and second RS latches;
   a first three-input NAND gate receiving the S input signal and the output signal of the first RS latch and the reset signal; and
   a second three-input NAND gate receiving the S input signal and the output signal of the second RS latch and the reset signal,
   wherein the results of comparison between the phase/frequency of the reference signal and that of the signal to be compared are represented by output signals of the first and second three-input NAND gates,
   and wherein the output signal of the first RS latch is input to the first three-input NAND gate via a delay device, and the output signal of the second RS latch is input to the second three-input NAND gate via another delay device.

5. The phase-locked loop circuit of claim 4, wherein the first phase/frequency detector shares the first and second RS latches and the reset circuit in common with the second phase/frequency detector,
   and wherein the first phase/frequency detector includes:
      a third three-input NAND gate receiving the S input signal and the output signal of the first RS latch and the reset signal; and
      a fourth three-input NAND gate receiving the S input signal and the output signal of the second RS latch and the reset signal,
   and wherein the results of comparison between the phase/frequency of the reference signal and that of the signal to be compared are represented by output signals of the third and fourth three-input NAND gates.

6. The phase-locked loop circuit of claim 1, wherein the charging pump circuit section includes:
   a first charging pump circuit supplying current to the low-pass filter if the first phase/frequency detector has detected a phase/frequency difference; and
   a second charging pump circuit supplying current to the low-pass filter if the second phase/frequency detector has detected a phase/frequency difference.

7. The phase-locked loop circuit of claim 1, wherein the charging pump circuit section comprises:
   a basic charging pump circuit including a first constant current source connected to a power supply line and a second constant current source connected to a ground line, the basic charging pump circuit supplying a predetermined amount of current from a current supply point between the first and second constant current sources if the first phase/frequency detector has detected a phase/frequency difference;
   a first current-controlling switch provided between the power supply line and the current supply point in parallel with the first constant current source, the first current-controlling controlling switch turning ON if the second phase/frequency detector has detected a phase lead in the reference signal and turning OFF if the second phase/frequency detector has detected no phase lead in the reference signal; and
   a second current-controlling switch provided between the ground line and the current supply point in parallel with the second constant current source, the second current-controlling switch turning ON if the second phase/frequency detector has detected a phase lag in the reference signal and turning OFF if the second phase/frequency detector has detected no phase lag in the reference signal.

8. The phase-locked loop circuit of claim 7, wherein the charging pump circuit section further includes:
   a third constant current source provided between the first current-controlling switch and the power supply line; and
   a fourth constant current source provided between the second current-controlling switch and the ground line.

* * * * *